United States Patent [19]

Watts

[11] Patent Number: 4,987,364
[45] Date of Patent: Jan. 22, 1991

[54] ELECTRICAL TESTING PROBE

[75] Inventor: Vivian C. Watts, Towbridge, United Kingdom

[73] Assignee: Bath Scientific Limited, Melksham, United Kingdom

[21] Appl. No.: 449,197

[22] Filed: Dec. 12, 1989

[30] Foreign Application Priority Data

Dec. 15, 1988 [GB] United Kingdom ............ 8829273

[51] Int. Cl.⁵ .................. G01R 31/02; G01R 31/22
[52] U.S. Cl. ........................ 324/158 P; 324/158 F; 439/482
[58] Field of Search .......... 324/158 R, 158 P, 72.5, 324/537; 439/482

[56] References Cited

U.S. PATENT DOCUMENTS

| | | | |
|---|---|---|---|
| 3,851,249 | 11/1974 | Roch | 324/158 P |
| 4,045,737 | 8/1977 | Coberly | 324/158 P |
| 4,245,189 | 1/1981 | Wahl et al. | 324/158 P |
| 4,251,772 | 2/1981 | Worsham et al. | 324/158 P |
| 4,697,143 | 9/1987 | Lockwood et al. | 324/158 P |
| 4,764,723 | 8/1988 | Strid | 324/158 P |
| 4,773,877 | 9/1988 | Krueger et al. | 439/482 |
| 4,806,856 | 2/1989 | Hverzda et al. | 324/158 P |
| 4,888,550 | 12/1989 | Reid | 324/158 P |

Primary Examiner—Reinhard J. Eisenzopf
Assistant Examiner—Vinh P. Nguyen
Attorney, Agent, or Firm—Nilsson, Robbins, Dalgarn, Berliner, Carson & Wurst

[57] ABSTRACT

For contacting electrical pads of different geometries, an electrical testing probe including a probe body which is generally laminar and which tapers downwardly to provide a contact portion; and a carrying member which carries said probe body.

9 Claims, 3 Drawing Sheets

ELECTRICAL TESTING PROBE

The present invention relates to an electrical testing probe, for example for use in testing printed circuit boards.

In the field of testing printed circuit boards, for example such boards before they have components added, a method of testing requires more than one moving electrical testing probe. A requirement of such a probe is that it has a small area of contact such that it does not make a short circuit between closely spaced electrical pads that may be present on the printed circuit board. Additionally, it is often a requirement that probes come into close proximity with each other; and further that a probe can provide when necessary a purely vertical motion with no horizontal motion when making contact with the printed circuit board so that no scrubbing action takes place between the probe and the probed surface which could damage the surface being tested.

Current designs of probes have probe bodies with very small diameters and are able to cater for the above requirements. FIG. 1 shows schematically such a probe, in which reference numeral 1 denotes the probe, this comprising a probe body 2 held springloaded in a sleeve 3 of a stand-off member 4. FIG. 2 shows two such probes with a typical minimum probe separation A in one horizontal direction.

However, such a probe as is shown in FIG. 1 may not adequately meet the requirement that it can probe both an electrical pad with a small geometry and also a pad which has a large geometry with a hole in the centre of the pad. Although such a probe will adequately contact the former, in the case of the latter it could travel down the centre of the pad and through the hole without making electrical contact (see FIG. 3 in which reference numeral 5 denotes a pad with a small geometry and FIG. 4 in which reference numeral 6 denotes a pad with a large geometry).

According to the present invention, there is provided an electrical testing probe comprising: a probe body which is generally laminar and which tapers downwardly to provide a contact portion; and a carrying member which carries said probe body.

The present invention will now be described, by way of example, with reference to FIGS. 5 to 10 of the accompanying drawings, in which.

Figure 1:
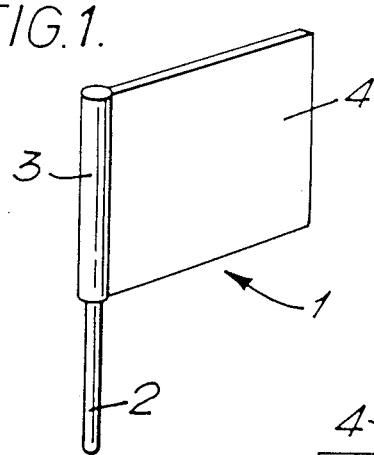
Figure 2:
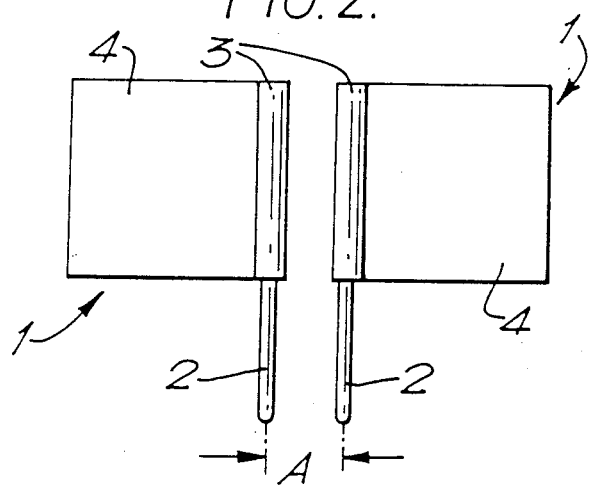
Figure 3:
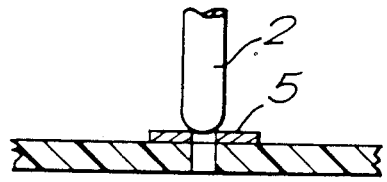
Figure 4:
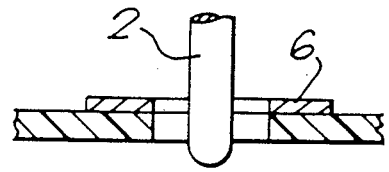
Figure 5:
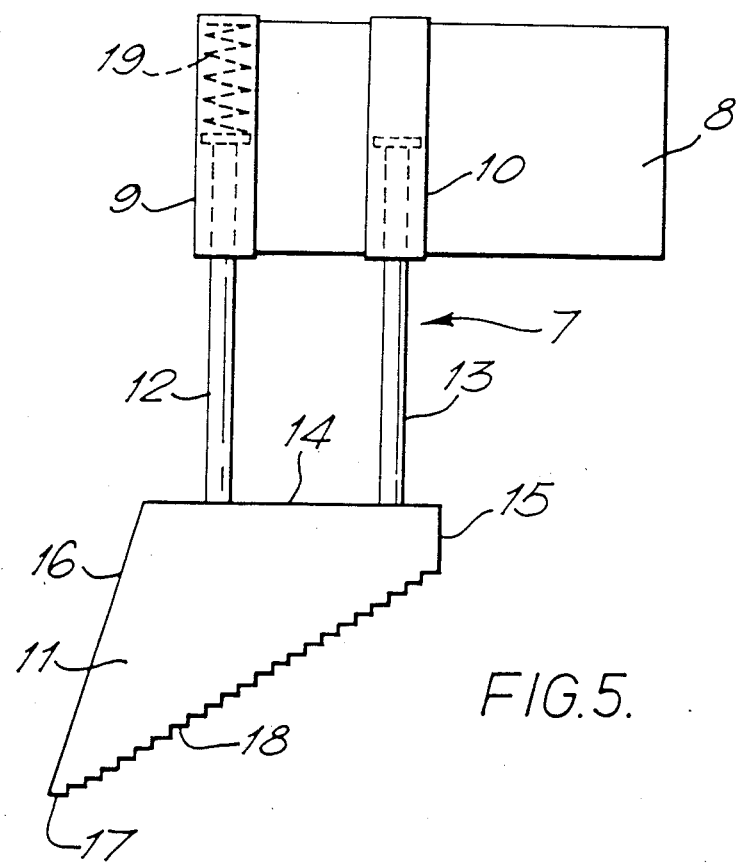
FIG. 5 shows from one side a probe according to an example of the invention.
Figure 6:
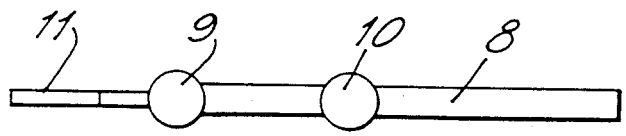
FIG. 6 shows a view from above of the probe.

Referring first to FIG. 5, a probe 7 according to an example of the invention comprises a stand-off member 8 which carries sleeves 9 and 10, reference numeral 11 denoting a laminar probe body in the form of a thin blade of electrically conductive material. The probe body 11 is carried by a rod-shaped member 12 which is held by virtue of a spring 19 in a springloaded manner in sleeve 9 and a rod-shaped member 13 which slides in sleeve 10 and serves to prevent rotation of the probe body 11.

The probe body 11 has a straight upper side 14 which is horizontal; a first, straight lateral side 15 which is vertical; a second, straight lateral side 16 which is raked backwards from a tip 17 of the probe body; and a lower side 18 whereby the probe body tapers downwardly towards tip 17. As shown, side 18 is formed to have a stepped or staircase pattern, although it could, if desired, be a straight side.

Such a probe may be used in a system comprising a further such probe for testing automatically printed circuit boards. Each of the probes would be movable automatically in two orthogonal (X and Y) horizontal directions and in the vertical (Z) direction. The probes would be moved to contact specific points on the printed circuit board for the purpose of automatically making resistive and/or capacitive checks under the control of a computer. For example, two such probes may be used in apparatus as described in U.S. patent application Ser. No. 397,612 filed on Aug. 22, 1989 and entitled TESTING ELECTRICAL CIRCUITS (which is a Continuation-in-Part of U.S. patent application Ser. No. 326,697 filed on Mar. 21, 1989), now co-pending.

By virtue of the side 16 of the probe body 11 raking back at an angle to the vertical from the tip 17, if this side is out of parallel with the vertical, it will not cause two such probe bodies to make contact with each other when they come in close proximity.

The horizontal dimension of tip 17 determines the minimum size of electrical pad with which contact can safely be made without shorting out an adjacent pad. In conjunction with the thickness of the probe body 11, it determines the surface area contact that is made with a surface being tested.

Figure 9:
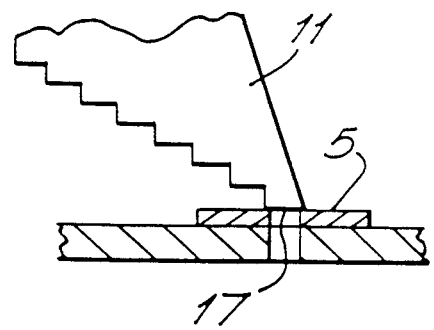
FIGS. 9 and 10 show the probe body of such a probe contacting an electrical pad with a small geometry and an electrical pad with a large geometry respectively.
Figure 10:
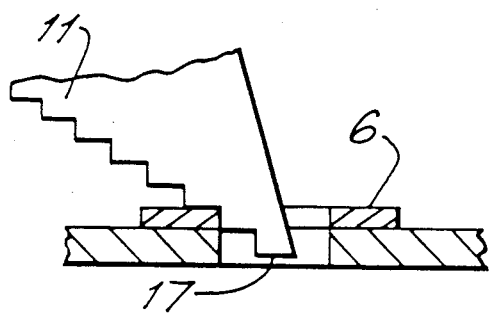

By virtue of sides 16 and 18 of the probe body 11 whereby the latter tapers downwardly towards its tip 17, the probe body 11 can contact both an electrical pad with a small geometry and an electrical pad with a large geometry (without merely passing through the centre of the hole of the latter without making electrical contact with the pad). This is shown by way of FIGS. 9 and 10 respectively.

Although, as mentioned, the side 18 could be a straight edge, if it has a staircase shape as shown, this means that when making contact with a pad of large geometry, the probe body 11 is likely to catch on the edge of the hole via one of the steps of the staircase shape and not have a sideways bias which might occur with a straight edge in a similar circumstance.

As well as side 16 being raked back at an angle to the vertical from tip 17, also side 18 is raked back at an angle to the vertical from the tip 17. This is so that the probe body 11 does not make contact outside the tip 17 on a flat surface.

Figure 7:
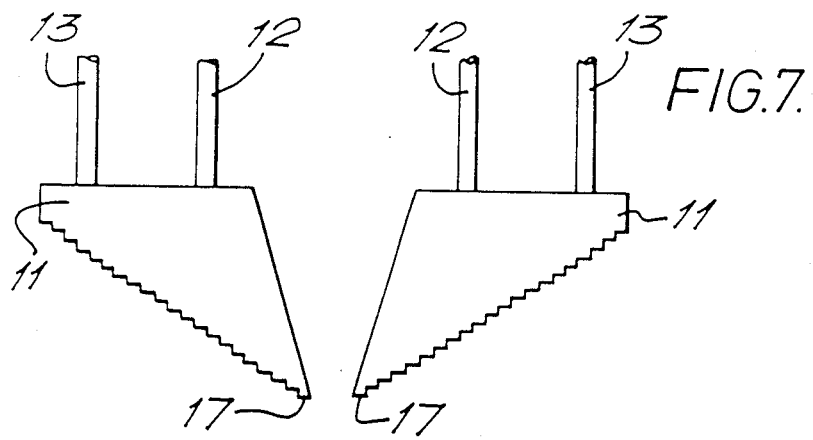
FIG. 7 shows from one side two such probes near each other and with a typical minimum separation in one horizontal direction.

It is to be noted that the tip 17 is forward of the spring-loaded member 12 so that two such probes can come as close together as is practical at their probe body tips 17 in one horizontal direction - see FIG. 7.

Figure 8:
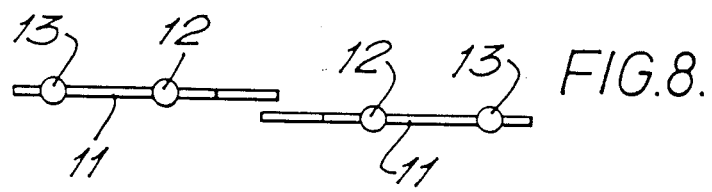
FIG. 8 shows a view from above of two such probes near each other and with a typical minimum separation in an orthogonal horizontal direction.

The thickness of the probe body 11 determines how close two such probes can come together in an orthogonal horizontal direction when they are adjacent each other - see FIG. 8.

In the light of the foregoing, it will be appreciated that: at least two such probes 7 can coexist together and can be moved in both the X and Y directions such that their tips 17 can come into close proximity with each other in either the X or Y direction; a motion of the tip 17 of the probe can be effected in purely the Z direction with minimum scrubbing action in the X and Y directions; and such a probe can adequately make contact with electrical pads with both small and large geometries without the requirement to offset mechanically the centre of action of the probe tip.

I claim:

1. An electrical testing probe for use in testing a printed circuit board, comprising:
    a probe body which is generally laminar and which tapers downwardly to provide a contact portion, said contact portion being operable to make electrical contact with specific points on the printed circuit board said probe body having an upper side, a first lateral side, a second lateral side, and a lower side, said lower side being at an angle of rake with respect to the body and having a stepped configuration, said probe body tapering downwardly to a tip formed by said second lateral side and said lower side; and
    carrying means for carrying said probe body.

2. An electrical testing probe according to claim 1, wherein said carrying means comprises a carrying member and resilient mounting means for mounting said probe body on said carrying member.

3. An electrical testing probe according to claim 2, wherein said resilient mounting means comprises a sleeve carried by said carrying member and an elongate member extending from said probe body into said sleeve, said elongate member being held in a spring-loaded manner in said sleeve.

4. An electrical testing probe according to claim 3, wherein said carrying means further comprises a second sleeve and a second elongate member extending from said probe body, the second elongate member extending into and being slidable in said second sleeve and serving to prevent rotation of said probe body with respect to said carrying means.

5. An electrical testing probe according to claim 1, wherein said second lateral side is at an angle of rake with respect to the vertical.

6. An electrical testing probe, for use in testing a printed circuit board comprising:
    a probe body which is generally laminar and which tapers downwardly to provide a contact portion; said contact portion being operable to make electrical contact with specific points on the printed circuit board and
    carrying means for carrying said probe body, said carrying means comprising a carrying member and resilient mounting means for mounting said probe body on said carrying member, said resilient mounting means comprising a first sleeve carried by said carrying member and a first elongate member extending from said probe body into said sleeve, said first elongate member being held in a spring-loaded manner in said first sleeve, and a second sleeve and second elongate member extending from said probe body, said second elongate member extending into and being slidable into said second sleeve and serving to prevent rotation of said probe body with respect to said carrying member.

7. An electrical testing probe according to claim 6, wherein said probe body has an upper side, a first lateral side, a second lateral side and a lower side, the lower side being at an angle of rake with respect to the vertical and said probe body tapering downwardly to a tip formed by said second lateral side and said lower side.

8. An electrical testing probe according to claim 7, wherein said second lateral side is at an angle of rake with respect to the vertical.

9. An electrical testing probe according to claim 8, wherein said lower side has a stepped configuration.

* * * * *